(12) United States Patent
Wang et al.

(10) Patent No.: US 10,475,930 B2
(45) Date of Patent: Nov. 12, 2019

(54) METHOD OF FORMING CRYSTALLINE OXIDES ON III-V MATERIALS

(71) Applicants: Samsung Electronics Co., Ltd., Gyeonggi-do (KR); Board of Regents, The University of Texas System, Austin, TX (US)

(72) Inventors: Wei-E Wang, Austin, TX (US); Mark S. Rodder, Dallas, TX (US); Robert M. Wallace, Garland, TX (US); Xiaoye Qin, Richardson, TX (US)

(73) Assignees: Samsung Electronics Co., Ltd., Gyeonggi-do (KR); Board of Regents, The University of Texas System

( * ) Notice: Subject to any disclaimer, the term of this patent is extended or adjusted under 35 U.S.C. 154(b) by 0 days.

(21) Appl. No.: 15/359,480

(22) Filed: Nov. 22, 2016

(65) Prior Publication Data

US 2018/0053859 A1 Feb. 22, 2018

Related U.S. Application Data

(60) Provisional application No. 62/376,353, filed on Aug. 17, 2016.

(51) Int. Cl.
| | | |
|---|---|---|
| *H01L 29/10* | (2006.01) | |
| *H01L 29/12* | (2006.01) | |
| *H01L 29/786* | (2006.01) | |
| *H01L 21/02* | (2006.01) | |
| *H01L 29/04* | (2006.01) | |

(52) U.S. Cl.
CPC .. *H01L 29/78681* (2013.01); *H01L 21/02172* (2013.01); *H01L 21/02293* (2013.01); *H01L 29/04* (2013.01); *H01L 29/7869* (2013.01)

(58) Field of Classification Search
CPC ......... H01L 29/78681; H01L 21/02172; H01L 21/02293; H01L 29/7869; H01L 29/04
See application file for complete search history.

(56) References Cited

U.S. PATENT DOCUMENTS

| | | | |
|---|---|---|---|
| 6,030,453 | A | 2/2000 | Passlack et al. |
| 6,469,357 | B1 | 10/2002 | Hong et al. |
| 7,692,224 | B2 | 4/2010 | Droopad et al. |
| 8,324,086 | B2 | 12/2012 | Shimomura et al. |
| 9,076,839 | B2 | 7/2015 | Shimomura et al. |

(Continued)

FOREIGN PATENT DOCUMENTS

| | | |
|---|---|---|
| JP | 59052832 A | 3/1984 |
| WO | WO 02/09157 A2 | 1/2002 |

OTHER PUBLICATIONS

English Machine Translation, JP 59052832 A, published Mar. 27, 2984, Ootsuki, 2 pages.

*Primary Examiner* — Ismail A Muse
(74) *Attorney, Agent, or Firm* — Van Pelt, Yi & James LLP

(57) ABSTRACT

A metal oxide semiconductor field effect transistor (MOSFET) includes a substrate having a source region, a drain region, and a channel region between the source region and the drain region, the substrate having an epitaxial III-V material that includes three elements thereon, a source electrode over the source region, a drain electrode over the drain region, and a crystalline oxide layer including an oxide formed on the epitaxial III-V material in the channel region, the epitaxial III-V material including three elements.

7 Claims, 2 Drawing Sheets

(56) References Cited

U.S. PATENT DOCUMENTS

| | | |
|---|---|---|
| 9,312,138 B2* | 4/2016 | Chi .................... H01L 21/28185 |
| 2003/0034491 A1 | 2/2003 | Lempkowski et al. |
| 2004/0079285 A1 | 4/2004 | Li et al. |
| 2004/0166672 A1* | 8/2004 | Reinberg .......... H01L 21/31604 438/686 |
| 2005/0199967 A1* | 9/2005 | Hoffman ............. H01L 29/7869 257/411 |
| 2006/0019462 A1* | 1/2006 | Cheng ............. H01L 21/823412 438/400 |
| 2006/0131671 A1* | 6/2006 | Hegde ............... C23C 16/45529 257/406 |
| 2007/0087525 A1* | 4/2007 | Chen ................ H01L 21/76254 438/429 |
| 2009/0064922 A1* | 3/2009 | Boone .................... C30B 23/02 117/3 |
| 2010/0301390 A1* | 12/2010 | Ko ..................... H01L 29/7851 257/190 |
| 2012/0049180 A1* | 3/2012 | Yamada .............. H01L 29/2003 257/43 |
| 2012/0326212 A1* | 12/2012 | Fompeyrine ...... H01L 21/28158 257/200 |
| 2013/0207076 A1* | 8/2013 | Yoshimoto ........ H01L 21/28575 257/13 |
| 2013/0214331 A1* | 8/2013 | Laukkanen ....... H01L 21/02241 257/200 |
| 2013/0307022 A1* | 11/2013 | Mitsunaga ............ H01L 29/778 257/190 |
| 2013/0321087 A1* | 12/2013 | Lender, Jr. .............. H03F 3/195 330/296 |
| 2014/0231816 A1* | 8/2014 | Chiu .................... H01L 29/2003 257/76 |
| 2014/0246665 A1* | 9/2014 | Lang ..................... H01L 51/524 257/40 |
| 2014/0353771 A1 | 12/2014 | Wang et al. |
| 2015/0069469 A1* | 3/2015 | Saito ................. H01L 29/66462 257/194 |
| 2015/0270266 A1* | 9/2015 | Mitsunaga ............ H01L 29/778 257/190 |
| 2015/0295075 A1* | 10/2015 | Green ................... H01L 29/402 257/76 |
| 2015/0364325 A1* | 12/2015 | Hatem ................ H01L 21/3245 438/522 |
| 2015/0381174 A1* | 12/2015 | Kato ........................ G06F 1/32 326/38 |
| 2016/0020283 A1* | 1/2016 | Bayram ............ H01L 21/02381 257/76 |
| 2016/0090665 A1* | 3/2016 | Okayama ................ C30B 25/10 117/88 |
| 2016/0163840 A1* | 6/2016 | Lee ................... H01L 29/78609 257/105 |
| 2016/0268401 A1* | 9/2016 | Aleksov ............. H01L 29/7869 |
| 2017/0073840 A1* | 3/2017 | Mori ....................... C30B 19/02 |
| 2017/0104083 A1* | 4/2017 | Chiu ................. H01L 29/42376 |
| 2017/0146868 A1* | 5/2017 | Chang ................. G09G 3/3677 |
| 2017/0227826 A1* | 8/2017 | Heo .................. G02F 1/136259 |
| 2017/0229460 A1* | 8/2017 | Czornomaz ......... H01L 27/0922 |
| 2017/0263420 A1* | 9/2017 | Suguro ................... C23C 16/18 |
| 2017/0321348 A1* | 11/2017 | Mori ....................... C30B 25/14 |
| 2017/0373149 A1* | 12/2017 | Bruce ................. H01L 29/1041 |

* cited by examiner

METHOD OF FORMING CRYSTALLINE OXIDES ON III-V MATERIALS

CROSS-REFERENCE TO RELATED APPLICATION(S)

This application claims priority to, and the benefit of, U.S. Provisional Application 62/376,353, filed on Aug. 17, 2016 in the U.S. Patent and Trademark Office, the entire content of which is incorporated herein by reference.

FIELD

One or more aspects of embodiments according to the present invention generally relate to crystalline oxide structures formed on III-V materials.

BACKGROUND

To continue to improve electronics, including memory devices, new types of channel materials corresponding to channel regions of metal oxide semiconductor field effect transistors (MOSFETs), along with corresponding architectures, continue to be researched. One group of channel materials, which are referred to as III-V materials, or III-V compounds, are already used in communication products and optoelectronic products, and are now receiving widespread attention in the course of channel material research.

III-V materials are chemical compounds with at least one group III element and at least one group V element. III-V materials generally have much higher electron mobility and conductivity than silicon materials, making III-V materials potentially useful for future high-speed, low-power applications, and also making III-V materials candidates for advances in complementary metal-oxide-semiconductor (CMOS) technology.

Among III-V materials, InAs (Indium-Arsenide) has very high electron mobility, but also has a relatively low bandgap, thereby limiting their use in general CMOS applications due to a corresponding high leakage current resulting from the low bandgap. InGaAs (Indium-Gallium-Arsenide) materials, on the other hand, provide a more promising potential for future low-power, high-mobility field effect transistors due to having relatively high electron mobility while also having a higher bandgap than InAs materials. InGaAs materials, therefore, exhibit a much lower degree of leakage current when compared to InAs materials.

Despite high electron mobility, III-V materials such as InGaAs (and InAs) typically suffer from a high density of interface defects ($D_{it}$ due to a lack of corresponding amorphous beneficial native oxides. Passivation of an interface between the III-V materials and a high-k (HK) dielectric layer deposited thereon may be used to realize the full potential of III-V materials. Extensive passivation schemes have been applied to passivate the III-V/HK interface, such schemes including chalcogenide (S, Se) passivation, various novel +3 valence dielectrics, such as TMA-1st $Al_2O_3$, $La_2O_3$, nitridation, etc. The key strategy for these passivation approaches is to remove as much of the naturally formed native amorphous oxides as possible before the subsequent HK deposition.

Another passivation approach to III-V materials may include passivating an InAs surface, and instead of removing the naturally formed native amorphous oxides, the approach intentionally forms the native oxides to yield a unique crystalline structure by subjecting the InAs surface to a specific controlled oxidizing environment, e.g., a molecular oxygen beam at around 3E-6 mbar, at a temperature of about 290° C. to about 330° C. The $D_{it}$ values obtained through this approach were shown to reach a low 3E11/cm²-eV of $D_{it}$. Accordingly, InAs-nFETs fabricated using this method could exhibit high mobility with the low $D_{it}$.

SUMMARY

Aspects of embodiments of the present disclosure are directed toward a method for forming a crystalline structure on surfaces of III-V materials that includes native oxides of the III-V materials, and toward a transistor including the same.

According to an embodiment of the present invention, there is provided a metal oxide semiconductor field effect transistor (MOSFET) including a substrate having a source region, a drain region, and a channel region between the source region and the drain region, the substrate having an epitaxial III-V material that includes three elements thereon, a source electrode over the source region, a drain electrode over the drain region, and a crystalline oxide layer including an oxide formed on the epitaxial III-V material in the channel region, the epitaxial III-V material including three elements.

The epitaxial III-V material may include $In_{0.53}Ga_{0.47}As$.

The epitaxial III-V material may include $In_xGa_{1-x}As$, x being in a range of about 0.2 to about 0.8.

A crystalline oxide layer on the epitaxial III-V material may have a (3×1)-O reconstruction.

A crystalline oxide layer on the epitaxial III-V material may have a (3×2)-O reconstruction.

The substrate may include at least one of InP, InAlAs, and/or InGaAs, and the epitaxial III-V material may have a thickness in a range of about 3 nm to about 50 nm.

The epitaxial III-V material may be formed on the substrate in a blanket manner, or is formed within a pre-patterned trench region.

The MOSFET may further include a dielectric material surrounding the pre-patterned trench region.

The dielectric material may be an oxide.

The crystalline oxide layer may include oxides including $In_2O$, $Ga_2O_3$, $Ga_2O$, and/or $As_2O_3$.

According to another embodiment of the present invention, there is provided a method of forming a crystalline oxide on a III-V material, the method including providing a substrate, forming a III-V material including three elements on the substrate by epitaxy, and forming a crystalline oxide layer including an oxide on the III-V material.

The method may further include removing $Ga_2O_3$ (Ga3+), removing $In_2O$ (In1+) and removing $As_2O_3$ (As3+) to form a (3×2)-O $Ga_2O$ oxide in the crystalline oxide layer.

Removing $Ga_2O_3$ (Ga3+), removing $In_2O$ (In1+), and removing $As_2O_3$ (As3+) may include annealing the substrate in atomic hydrogen at about 200° C. to about 400° C. for about 1 minute to about 10 minutes.

The method may further include adding Ga1+ to form a (3×2)-O oxide in the crystalline oxide layer.

The method may further include removing $Ga_2O_3$ (Ga3+), removing $In_2O$ (In1+), and removing $As_2O_3$ (As3+), such that $Ga_2O$ (Ga1+) remains in a crystalline manner to form a (3×2)-O oxide in the crystalline oxide layer.

The method may further include annealing the substrate in atomic hydrogen to remove $Ga_2O_3$ (Ga3+) oxide from the crystalline oxide layer.

The annealing the substrate in atomic hydrogen may include annealing in a range of about 200° C. to about 400° C. in a range of about 1 minute to about 10 minutes.

Annealing the substrate in atomic hydrogen may include annealing the substrate in atomic hydrogen or in atomic deuterium at a temperature of about 200° C. to about 400° C.

According to yet another embodiment of the present invention, there is provided a substrate including a material including three elements formed by epitaxy, and a crystalline oxide layer formed on the III-V material.

A crystalline oxide layer may have a (3×1)-O reconstruction or a (3×2)-O reconstruction.

BRIEF DESCRIPTION OF THE DRAWINGS

These and other aspects of embodiments of the present invention will be appreciated and understood with reference to the specification, claims, and appended drawings wherein:

DETAILED DESCRIPTION

Figure 1:
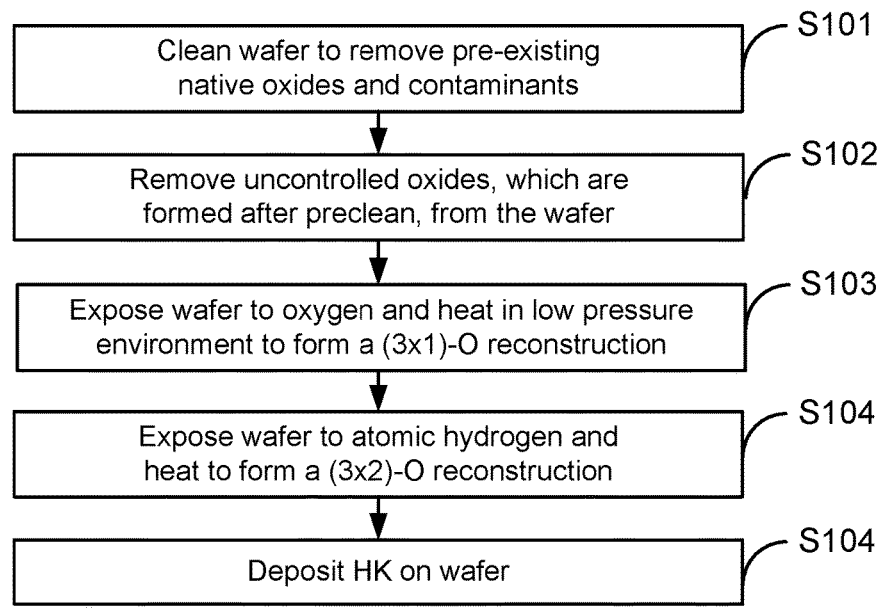
FIG. 1 is a flowchart for describing a method of forming a crystalline oxide structure on a surface of III-V materials, according to an embodiment of the present invention.

Aspects of embodiments of the present disclosure are directed toward a method for forming a crystalline structure on surfaces of III-V materials that includes native oxides of the III-V materials, and toward a transistor including the same.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the described embodiments.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As mentioned above, new materials are being examined for use in a channel region, or trench region, of MOSFETs. III-V materials, such as Indium-Gallium-Arsenide (InGaAs), appear to have promise.

Previously, efforts have been made to produce a suitable amorphous oxide structure by passivating III-V materials, but with limited success. Accordingly, renewed efforts may instead be directed toward forming crystalline oxides (as opposed to amorphous oxides) on III-V materials. However, due to difficulties associated with forming InGaAs crystalline oxides in a reproducible manner, there have not yet been optimal ways of forming crystalline oxides on InGaAs. By modifying III-V native oxides from an amorphous structure to a crystalline structure, a high carrier mobility may be achieved.

Crystalline oxide passivation has significant additional benefits when compared to traditional passivation schemes, such as those described above. It has been suggested that the mobility of III-V materials is likely limited by the surface scattering of the III-V materials due to the nature of an intrinsic wave function, which may be especially pronounced in scaled nodes for III-V materials. This scattering can be reduced if the channel material is adjacent a crystalline oxide layer or dielectric.

Additionally, among native oxides formed in III-V materials, $Ga_2O_3$, which may be formed due to a non-optimized condition that results in a high level of oxidation, can lead to the formation of the Ga3+ oxidation state, which is correlated to a defect response in capacitance-voltage (CV), and also correlated to degraded transistor performance. In contrast, the Ga1+ oxidation state, which may result from the formation of $Ga_2O$ oxide, results in a better interface that may be unpinned.

By having more native oxides associated with each of the three elements, formation of InGaAs oxides having a suitable structure may be more difficult to achieve when compared to native oxides associated with a compound having two elements, such as, for example, InAs. InAs, however, might not be a suitable channel material due to the relatively low bandgap of InAs (e.g., about 0.35 eV or 0.36 eV), which may be unacceptably low, thereby resulting in a high leakage current (e.g., of a transistor employing InAs as the channel material). Further, formation of InGaAs crystalline oxides by depositing on 1-2 ML of In on GaAs (as opposed to a regular bulk-InGaAs sample) might not be suitable for certain applications. Accordingly, Ga-related oxides may be improved, with $Ga_2O$ potentially being beneficial due to having comparatively lower $D_{it}$, while $Ga_2O_3$ may be less beneficial due to having higher $D_{it}$.

As previously described, a (3×1)-O crystalline oxide on two-element III-V materials (e.g., InAs) may be relatively easily achieved. However, the comparatively more complex three-element system (e.g., InGaAs) has not yet shown to generate crystalline oxide structures in a stable manner due to complications resulting from the insertion of the third element (e.g., Ga) and the corresponding native oxides (e.g., $Ga_2O_3$ and $Ga_2O$).

Embodiments described herein provide InGaAs as a channel material due to the adequately high mobility of InGaAs, which also has a much higher bandgap (e.g., about 0.74 eV), thereby resulting in a lower leakage current than that of InAs materials.

Embodiments described herein also overcome complications associated with forming a crystalline oxide that has a surface reconstruction of (3×1)-O structure composed of $As_2O_3$, $Ga_2O$, $Ga_2O_3$, and $In_2O$ in part with a suitable oxygen anneal. A (3×1)-O structure, although adequate for InAs, may still be insufficient to warrant a suitable crystalline oxide for InGaAs due to increased, or "excessive," oxidation resulting from the presence of the aforementioned oxide $Ga_2O_3$. The improved oxygen anneal may be followed by an improved atomic hydrogen anneal to subsequently selectively remove the undesirable and detrimental $Ga_2O_3$ while leaving behind the desired beneficial $Ga_2O$, thereby yielding a new crystalline oxide with a desirable surface reconstruction of (3×2)-O.

Thus, a new, highly stable crystalline oxide having a (3×2)-O structure may be formed, and may be ready for subsequent atomic layer deposition (ALD)-HK dielectrics, as is described below.

Figure 2A:
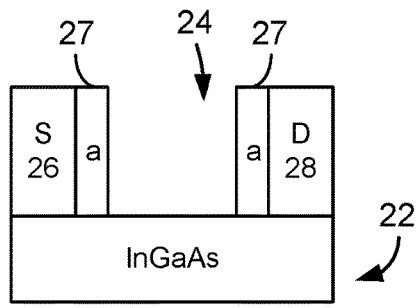
FIGS. 2A-D depict embodiments of an InGaAs wafer having a source electrode and a drain electrode thereon, according to an embodiment of the present invention
Figure 2B:
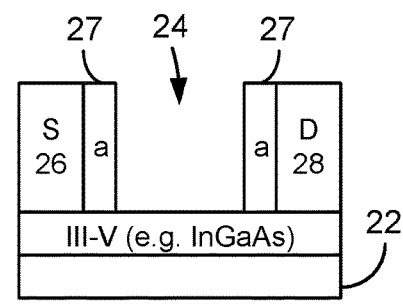
Figure 2C:
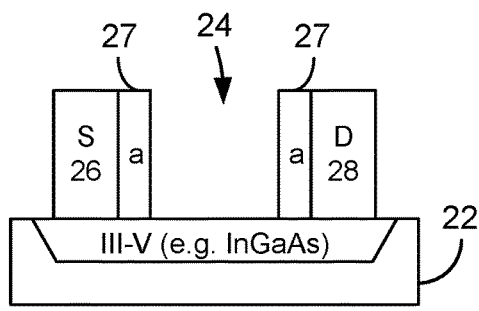
Figure 2D:
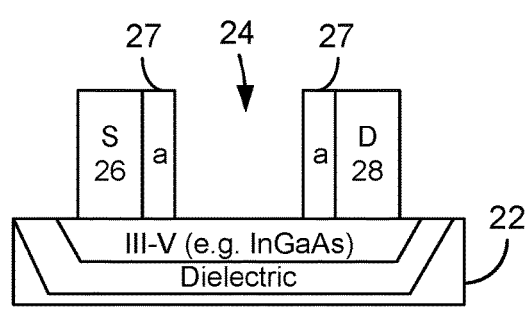

FIG. 1 is a flowchart for describing a method of forming a crystalline oxide structure on a surface of Ill-V materials. FIGS. 2A-2D depict embodiments of an InGaAs wafer having a source electrode and a drain electrode thereon, according to embodiments of the present invention. FIG. 2A depicts a generalized InGaAs substrate 22. FIG. 2B depicts a substrate having an epitaxial III-V material formed in a blanket manner thereon. FIG. 2C depicts a substrate having an epitaxial III-V material formed within a pre-patterned trench. FIG. 2D depicts a substrate having an epitaxial III-V material formed within a patterned trench which has a dielectric material surrounding the pre-patterned trench.

Referring to FIGS. 1 and 2A-2D, for example, the described method may be used to form a crystalline oxide structure using a wafer 22 (e.g. a substrate) with an exposed InGaAs channel region 24 (e.g., $In_xGa_{1-x}As$, with x being in a range of about 0.2 to about 0.8 or In0.3Ga0.47As), according to an embodiment of the present invention.

At S101, the wafer 22 is cleaned with one or more relevant chemical solutions (e.g., wet HF, HCl, etc.) to remove pre-existing native oxides and contaminants on the wafer 22 for preparation of a fresh, III-V material surface for subsequent crystalline oxide formation. That is, at S101, the wafer 22 with an exposed InGaAs channel region 24 may be inserted into a chamber, and may be exposed to a reaction chamber of reduced-pressure chemical vapor deposition (RP-CVD) or ultra-high vacuum chemical vapor deposition (UHV-CVD) (e.g., in a HK-last flow, after the dummy gate/oxide removal and after a relevant surface pre-clean).

As can be seen in FIGS. 2A-2D the InGaAs wafer 22 may have a source electrode 26 and a drain electrode 28 thereon. Additionally, there may be a spacer 27 on an inner surface of each of the source electrode 26 and the drain electrode 28. Further, the III-V material may have a thickness in a range of, for example, about 3 nm to about 50 nm. Although FIGS. 2C and 2D depict the trench and dielectric structures as extending past the electrodes a particular amount, in other embodiments, the trench and dielectric structure may extend a different (e.g. smaller) distance At S102, additional native oxides may be removed from the precleaned wafer 22. For example, the wafer 22 cleaned at S101 may be inserted into a vacuum system (e.g., a low pressure environment), and may be heated to a suitable temperature in a suitable reducing environment (e.g., a pure hydrogen or an $AsH_3$ rich environment), thereby removing additional native oxides that may form after the wafer 22 is cleaned at S101. That is, by heating the wafer 22 in a pre-hydrogen environment or an $AsH_3$ rich environment, the native oxides formed on a surface of the wafer 22 after the preceding wet preclean at S101 may be removed to prepare the surface of the wafer 22 for the subsequent crystalline oxide formation.

Optionally, at S101, the precleaned wafer 22 may be capped with arsenic. The As-capped blanket InGaAs wafer may be inserted into a molecular beam epitaxy (MBE) chamber before heating the wafer to a suitable temperature (e.g., a temperature of about 300° C. to about 400° C.) to remove the As-cap by vaporization. The As-cap may protect the III-V surface of the wafer from unwanted oxidation, and can later be removed to expose the III-V surface for subsequent crystal oxide formation (e.g., as described below). That is, at S101, the InGaAs surface of the wafer 22 may be capped with a protective layer (e.g., arsenic) to inhibit oxidation, and the protective layer may be thereafter removed by heating the wafer 22 to a desired temperature under vacuum/low pressure.

It should be further noted that any process that prepares the InGaAs surface of the wafer 22 to be rendered free of uncontrolled oxides may be suitably performed at S102.

Figure 3:
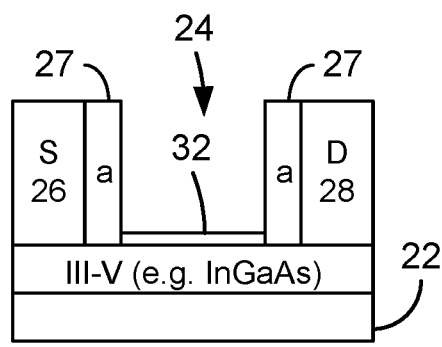
FIG. 3 depicts the InGaAs wafer of FIG. 2 with a reconstructed (3×2)-O $Ga_2O$ interfacial layer at a channel region of the InGaAs wafer, according to an embodiment of the present invention.

FIG. 3 depicts the InGaAs wafer of FIG. 2B with a reconstructed (3×2) $Ga_2O$ interfacial layer at a channel region of the InGaAs wafer, according to an embodiment of the present invention.

Referring to FIGS. 1 and 3, after removing the native oxides from the InGaAs surface of the wafer 22, at S103, a molecular oxygen source connected to the chamber in which the wafer 22 is inserted may be opened to flow oxygen into the chamber to yield a vacuum/low-pressure condition of about $10^{-6}$ to $10^{-6}$ mbars of pressure.

As can be seen in FIG. 3, the $Ga_2O$ native oxide 32 may remain on the surface of the wafer 22 (e.g., directly on the surface of the wafer, with no buffer layer therebetween) in the channel region 24 between the spacers 27, which are respectively on the inner surfaces of the source and drain electrodes 26 and 28. The $Ga_2O$ native oxide 32 may be a (3×2)-O reconstruction of a crystalline structure, and may be obtained by exposing the InGaAs material of the wafer 22 to oxygen in a controlled environment. As another example, the wafer 22 may be exposed to appropriate oxygen exposure conditions (e.g., substrate temperatures of about 280° C. to about 350° C., exposure time of about 10 minutes to about 30 minutes, and $O_2$ partial pressure of about 1E-6 to about 8E-5 mbar), which may achieve a (3×1)-O reconstruction. The (3×1)-O reconstruction may be a precursor to a (3×2)-O reconstruction, which is described below.

The quality of the (3×1)-O reconstruction can optionally be observed and analyzed with a relevant metrology tool (e.g., electron diffraction, such as Low Energy Electron Diffraction (LEED) or Reflection High Energy Electron Diffraction (RHEED)), such that the $O_2$ exposure conditions described above with respect to S103 (e.g., suitable substrate temp, suitable exposure time, and suitable $O_2$ exposure with partial pressure) can be configured. As another example, x-ray photoelectron spectroscopy may be used to observe the surface of the wafer 22 to determine the boundary structure without damaging the crystalline structure of the $Ga_2O$ oxide 32 thereon.

At S104, the wafer 22 may be exposed to a suitable atomic hydrogen exposure (e.g., at a temperature of about 200° C. to about 400° C. (e.g., about 350° C.) for about 1 minute to about 10 minutes (e.g., about 5 minutes)) to yield a distinctive and stable (3×2)-O reconstruction. The atomic hydrogen exposure may be performed in the same chamber. Following the atomic hydrogen exposure, it may be observed that the unfavorable $Ga_2O_3$ (Ga3+) chemical state has been removed from the surface of the wafer 22 as a result, thereby improving electrical characteristics corresponding to the presence of the remaining oxides. In the present embodiment, the remaining Ga1+ contributes positively to the stable (3×2)-O crystalline oxide reconstruction. As another example, a suitable hydrogen anneal (e.g., in molecular hydrogen or in molecular deuterium, at about 300° C. to about 400° C., and for about 1 minute to about 20 minutes) may be applied to render the surface of the wafer 22 in the channel region 24 from (3×1)-O to (3×2)-O.

Figure 4:
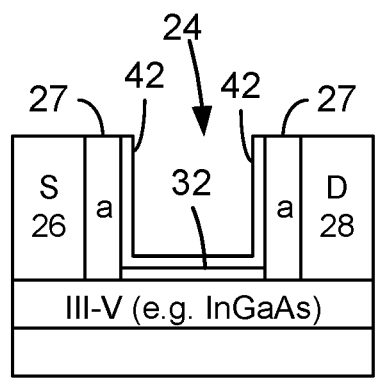
FIG. 4 depicts the InGaAs wafer of FIG. 3 with a high-k (HK) dielectric deposited on the reconstructed (3×2)-O $Ga_2O$ interfacial layer, according to an embodiment of the present invention.

FIG. 4 depicts the InGaAs wafer of FIG. 3 with a high-k (HK) dielectric deposited on the reconstructed (3×2)-O $Ga_2O$ interfacial layer, according to an embodiment of the present invention.

Referring to FIGS. 1 and 4, after S104, the wafer 22 is ready for subsequent HK deposition. For example, the wafer 22 may now be ready for the subsequent ALD-HK deposition 42 (e.g., $HfO_2$). As shown in FIG. 4, the HK layer 42 may be deposited on the $Ga_2O$ oxide 32 on the wafer 22 in the channel region 24, and may also be deposited on inner side walls of the spacers 27 (e.g., opposite the surfaces of the spacers 27 respectively contacting the source and drain electrodes 26 and 28). By forming a crystallized structure, as opposed to an amorphous structure, electrical characteristics may be improved (e.g., electrical characteristics of a MOSFET formed using the wafer 22 with the crystallized structure of $Ga_2O$ oxide 32 at the channel region 24 of the MOSFET).

It should be noted that the operations described above with respect to S101 to S105 can be done while the wafer 22 is in the same chamber, and with the same tools.

Using the crystalline oxide formation method described above to passivate InGaAs surface defects may be an inexpensive, cost-effective method, which uses only regular molecular oxygen gas in medium-vacuum conditions, together with subsequent readily available anneal gases. The method of the present embodiment may significantly reduce $D_{it}$, and may reduce $D_{it}$ while boosting electron mobility for InGaAs-nFETs without using novel toxic gases, and therefore may be highly manufacturable. However, the described crystalline oxide may be less thermally stable than $SiO_2$. A more careful choice of metal gates and the anneal temperatures in the downstream processes may be suitable.

The crystalline oxide layer may include various oxides formed from the individual elements including $In_2O$, $Ga_2O_3$, $Ga_2O$, and $As_2O_3$, with $As_2O_3$ acting to assist in ensuring the crystalline integrity of $In_2O$, and hence ensuring the thermal stability of the crystalline structure at higher temperatures. $Ga_2O_3$ formation, however, may be detrimental to the stability of the reconstructed surface. That is, during formation, the surface may be relatively rich with $Ga_2O_3$, and by effectively using atomic hydrogen anneal to remove $Ga_2O_3$ while leaving $Ga_2O$ (and others), thereby leaving a new (3×2)-O reconstructed surface ($Ga_2O$) remaining, an improved surface is achieved. The (3×2)-O reconstructed surface may be very stable while yielding low $D_{it}$ values.

As described above, the described embodiments are able to improve InGaAs crystalline oxide formation using improved conditions to yield an improved (3×1)-O surface (e.g., a mixture of indium oxides, gallium oxides, and arsenic oxides), which has $D_{it}$ values much lower than those with regular amorphous native oxides.

Also as described above, InGaAs surface defect passivation using the crystalline oxide formation can outperform other passivation schemes by significantly reducing the surface scattering (one of the key limiting factors for device performance at scaled nodes) due to its crystalline nature. Additionally, the methods of crystalline oxide formation may of the described embodiments provide a very cost-effective method by using only regular molecular oxygen gas in a medium vacuum environment together with subsequent readily available anneal gases.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A method of forming a crystalline oxide on a III-V material, the method comprising:
    providing a substrate;
    forming a III-V material comprising three elements on the substrate by epitaxy; and
    forming a crystalline oxide layer comprising an oxide on the III-V material, the step of forming the crystalline oxide layer including removing $Ga_2O_3$ (Ga3+), removing $In_2O$ (In1+) and removing $As_2O_3$ (As3+) to form a (3×2)-O $Ga_2O$ oxide in the crystalline oxide layer.

2. A method of forming a crystalline oxide on a III-V material, the method comprising:
    providing a substrate;
    forming a III-V material comprising three elements on the substrate by epitaxy;
    forming a crystalline oxide layer comprising an oxide on the III-V material; and
    removing $Ga_2O_3$ (Ga3+), removing $In_2O$ (In1+) and removing $As_2O_3$ (As3+) to form a (3×2)-O $Ga_2O$ oxide in the crystalline oxide layer;
    wherein removing $Ga_2O_3$ (Ga3+), removing $In_2O$ (In1+), and removing $As_2O_3$ (As3+) comprises annealing the substrate in atomic hydrogen at about 200° C. to about 400° C. for about 1 minute to about 10 minutes.

3. A method of forming a crystalline oxide on a III-V material, the method comprising:
    providing a substrate;
    forming a III-V material comprising three elements on the substrate by epitaxy;
    forming a crystalline oxide layer comprising an oxide on the III-V material; and
    adding Ga1+ to form a (3×2)-O oxide in the crystalline oxide layer.

4. A method of forming a crystalline oxide on a III-V material, the method comprising:
    providing a substrate;
    forming a III-V material comprising three elements on the substrate by epitaxy; and
    forming a crystalline oxide layer comprising an oxide on the III-V material;
    removing $Ga_2O_3$ (Ga3+), removing $In_2O$ (In1+), and removing $As_2O_3$ (As3+), such that $Ga_2O$ (Ga1+) remains in a crystalline manner to form a (3×2)-O oxide in the crystalline oxide layer.

5. A method of forming a crystalline oxide on a III-V material, the method comprising:
    providing a substrate;
    forming a III-V material comprising three elements on the substrate by epitaxy;
    forming a crystalline oxide layer comprising an oxide on the III-V material; and
    annealing the substrate in atomic hydrogen to remove $Ga_2O_3$ (Ga3+) oxide from the crystalline oxide layer.

6. The method of claim 5, wherein the annealing the substrate in atomic hydrogen comprises annealing in a range of about 200° C. to about 400° c. in a range of about 1 minute to about 10 minutes.

7. The method of claim 6, wherein annealing the substrate in atomic hydrogen comprises annealing the substrate in atomic hydrogen or in atomic deuterium at a temperature of about 200° C. to about 400° c.

* * * * *